United States Patent [19]
Yaklin

[11] Patent Number: 6,157,222
[45] Date of Patent: Dec. 5, 2000

[54] LOW POWER ADJUSTABLE INPUT THRESHOLD CIRCUIT

[75] Inventor: Daniel A. Yaklin, Garland, Tex.

[73] Assignee: Texas Instruments Incorporated, Dallas, Tex.

[21] Appl. No.: 09/280,431

[22] Filed: Mar. 29, 1999

[51] Int. Cl.$^7$ .................................................. H03K 5/153
[52] U.S. Cl. ................................ 327/81; 327/74; 327/68; 327/285; 324/74
[58] Field of Search .................................. 327/77, 80, 81, 327/108, 111, 112, 264, 270, 271, 272, 277, 278, 281, 284, 285, 288, 68, 74, 205, 206, 434, 437; 324/74, 130, 601; 702/85

[56] References Cited

U.S. PATENT DOCUMENTS

| | | | |
|---|---|---|---|
| 5,220,216 | 6/1993 | Woo | 327/278 |
| 5,684,423 | 11/1997 | Koyashiki et al. | 327/270 |
| 5,821,783 | 10/1998 | Torimaru et al. | 327/108 |

*Primary Examiner*—Toan Tran
*Attorney, Agent, or Firm*—Alan K. Stewart; Wade James Brady, III; Frederick J. Telecky, Jr.

[57] ABSTRACT

A variable threshold comparator receiving, on an input node, an input signal having a voltage, and providing an output signal on an output node when the voltage of the input signal exceeds a selectable threshold voltage of the comparator. The comparator includes a transistor coupled by way of its source and drain between a power supply and an output node, and having its gate coupled to the input node. Also included are a plurality of pairs of transistors coupled together by a source of a first one of the pair of transistors and drain a drain of a second one of the pair of transistors, and coupled in series between the output node and a ground, a gate of the first one of the transistors coupled to the input node, and a gate of the second one of the transistors coupled to a control signal specific to the second one of the transistors. The threshold voltage of the comparator is selectable by the application of one or more of the control signals to a respective one or more of the second ones of said transistors.

2 Claims, 7 Drawing Sheets

LOW POWER ADJUSTABLE INPUT THRESHOLD CIRCUIT

FIELD OF THE INVENTION

The invention relates to voltage comparators, and more particularly relates to establishing voltage comparator input threshold control.

BACKGROUND OF THE INVENTION

Voltage comparators are used in electronic systems to detect that a signal of interest has attained some predetermined value which is commonly referred to as the threshold level. When this event occurs the comparator produces a change in logic level at its output to indicate the threshold level has been attained. The threshold detection function of a voltage comparator is typically accomplished by electronically comparing the signal of interest to an externally supplied reference voltage.

An example of an application of a voltage comparator is the detection that a primary power supply voltage has exceeded specification limits, thereby warranting a corrective action of some sort, such as system shutdown. Another application is the detection of the presence or absence of a data transmission cable, through a bias voltage present in the cable when connected, to begin or halt data transmission or reception, or otherwise indicate the connection status of the cable.

The threshold detection function of a voltage comparator is typically accomplished by electronically comparing the signal of interest to an externally supplied reference voltage. The primary technical issues associated with the use of a voltage comparator are precision of the external reference power supply, accuracy of the electronic comparison, and power requirements of the included components. The complexity of the comparator implementation therefore varies between wide extremes depending upon the specific application and associated requirements. Moreover, setting and controlling the threshold level for the comparator is the main contributor to complexity and power consumption due to the necessity for a reference power supply that typically must remain powered on during system operation.

A further requirement of a comparator is that it must produce a change in logic state at its output that corresponds to the signal of interest having attained the threshold level in both positive and negative going directions. For example, if the comparator output is at a logic "1" when the signal of interest is below the threshold level, the output must change to a logic "0" and remain there when the threshold level is reached or exceeded. Also, for this example, the comparator output must change from a logic "0" to a logic "1" and remain there when the signal of interest falls below the threshold level.

Three examples of the prior art are now described, and serve to illustrate various degrees of complexity associated with setting a comparator threshold level. The detailed requirements of a specific application will directly determine the means by which the threshold level is to be set with possible tradeoffs between precision and power consumption.

The simplest approach to accomplishing the comparator function, though not commonly referred to as such, is through the use of a simple inverter as shown in FIG. 1. The signal of interest $V_{IN}$ is applied to the input of inverter 10, and upon reaching the threshold level of the input gate of a semiconductor device within the inverter 10, causes the output of inverter 10 to change logic states. The threshold level is determined by the particular device used to form the input gate, the power supply voltage, and operating temperature. This approach has very low power requirements, but does not provide a means of adjusting the threshold level. Nor does it provide the accuracy required of most comparator applications in determining that the threshold level has been reached.

FIG. 2 illustrates a differential comparator circuit wherein $V_{OUT}$ will change logic states when the signal of interest, Vin, equals or exceeds the threshold level, Vth. The threshold level for the comparator is established through use of an external precision reference power supply 14 as the second input to the comparator. This approach is often enhanced to achieve improved performance by adding circuitry for temperature compensation and reducing power supply drift, but with a penalty of increased power consumption and complexity.

FIG. 3 also shows a differential comparator, but with the addition of a digital to analog converter, ("DAC") 18, used in conjunction with an external reference supply 20 for setting the threshold level, Vth. The threshold level is set by means of a serial programming bus 22 to the DAC 18, and may be changed as the specific application or operating conditions may dictate. This approach offers substantially improved threshold level accuracy, but with increased power consumption and complexity, over that achievable with the examples described above.

It is readily seen from these examples of the prior art that the precision and adjustability requirements for setting a threshold level dictate the degree of circuit complexity and power consumption that are incurred in a particular application.

SUMMARY OF THE INVENTION

In accordance with the present invention there is provided, according to one aspect thereof, a variable threshold comparator receiving, on an input node, an input signal having a voltage, and providing an output signal on an output node when the voltage of the input signal exceeds a selectable threshold voltage of the comparator. The comparator includes a transistor coupled by way of its source and drain between a first polarity power supply node and an output node, and having its gate coupled to the input node. Also included are a plurality of pairs of transistors coupled together by a source of a first one of the pair of transistors and drain a drain of a second one of the pair of transistors, and coupled in series between the output node and a second polarity power supply node, a gate of the first one of the transistors coupled to the input node, and a gate of the second one of the transistors coupled to a control signal specific to the second one of the transistors. The threshold voltage of the comparator is selectable by the application of one or more of the control signals to a respective one or more of the second ones of said transistors.

According to another aspect of the present invention there is provided a variable threshold comparator receiving, on an input node, an input signal having a voltage, and providing an output signal on an output node when the voltage of the input signal exceeds a selectable threshold voltage of the comparator. The comparator according to this aspect includes a first plurality of pairs of transistors, each pair, denominated the first pair, in the first plurality of pairs of transistors being coupled together by a source of a first one of the first pair of transistors and drain a drain of a second one of the first pair of transistors, and coupled in series between the output node and a first polarity power supply node. A gate of the first one of the first pair of transistors is coupled to the input node, and a gate of the second one of the first pair of transistors is coupled to a control signal specific to the second one of the first pair of the transistors. A second plurality of pairs of transistors is also included, each pair, denominated the second pair, in the second plurality of pairs of transistors being coupled together by a source of a first one of the second pair of transistors and drain a drain of a second one of the second pair of transistors, and coupled in series between the output node and a second polarity power supply node. A gate of the first one of the second pair of transistors is coupled to the input node, and a gate of the second one of the second pair of transistors is coupled to a control signal specific to the second one of the second pair of transistors. The threshold voltage of the comparator is selectable by the application of one or more of the control signals to a respective one or more of the second ones of the transistors.

The invention will best be understood from the claims when read in conjunction with the detailed description and drawings herein.

Figure 1:
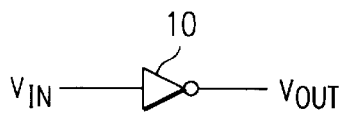
FIG. 1 is a first example of the prior art.
Figure 2:
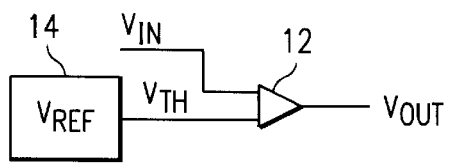
FIG. 2 is a second example of the prior art.
Figure 3:
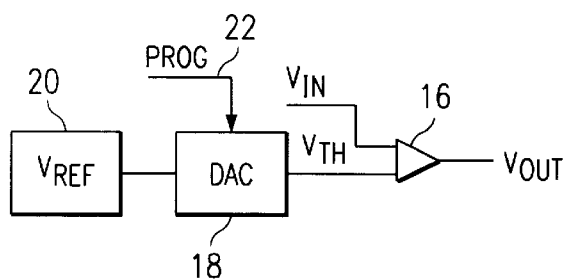
FIG. 3 is a third example of the prior art.

Common reference designators are used throughout the drawings and are replicated wherever necessary for purposes of clarity.

DETAILED DESCRIPTION OF THE PREFERRED EMBODIMENT

The preferred embodiment of the present invention is disclosed herein in the context of its use in a semiconductor device known as a Cable Transceiver/Arbiter, as defined by IEEE Standard 1394 which delineates the performance requirements for the analog and digital physical layer functions for a high performance serial data bus. In this context the preferred embodiment performs the function commonly referred to as Cable Not Active (CNA), and in so doing includes means to detect the connection status of a data transmission cable and indicate that status to the control logic of the semiconductor device.

It will be seen that the preferred embodiment significantly reduces power consumption in performing a voltage comparator-type function, and also significantly reduces the propagation delay time of the change in output logic level, when compared to that of the prior art.

It will be seen from the discussion below that the preferred embodiment includes means for performing an electronic comparison of the signal of interest to a predetermined reference or threshold value. It will further be seen that the preferred embodiment provides a logic level output signal whenever the signal of interest has equaled or exceeded this threshold value in both positive and negative going directions.

The threshold level for the aforementioned electronic comparison is realized by the inclusion of circuit elements in a cascade configuration comprised of transistors with appropriately different conduction channel dimensions. It will be seen the preferred embodiment includes means for adjusting the threshold level of a comparator circuit through application of externally supplied fixed control voltages to the cascaded elements, as might be necessary to compensate for variations in device process, operating temperature, power supply voltage, or other operating conditions.

It will further be seen the preferred embodiment is readily expandable or contractible by the addition or deletion of almost identical circuit elements to the cascade configuration, the difference in these circuit elements being only individual transistor conduction channel dimensions. It will be seen the preferred embodiment is thus able to accommodate the selection of different threshold levels for the signal of interest as specific application requirements may dictate.

The preferred embodiment includes means for selecting the desired degree of precision for the aforementioned electronic comparison also through the addition or deletion of circuit elements to the cascade configuration. These circuit elements too would differ only in individual transistor conduction channel dimensions.

It should be noted here as a matter of terminology that the threshold level for an individual transistor, as opposed to that for a comparator, is that voltage at which the transistor is placed in, or removed from, a conductive state by application of the voltage to the transistor gate. Throughout this description the terms "threshold value" or "threshold level" when applicable to the signal of interest is denoted as "Vth", and when applicable to an individual transistor will be denoted as "Vt."

The MOS transistor can be empirically characterized as an almost linear device wherein the drain current is proportional to the voltage applied to the transistor gate for fixed values of threshold voltage (Vt), source-to-drain voltage, channel width, and channel length. Further, the conductance of a MOS transistor is proportional to the device channel width and length for fixed device-peculiar parameters that are dependent upon materials content and manufacturing process. The conductance of a MOS transistor, or, inversely, its resistivity, is also determined by its threshold voltage and the voltage applied to its gate, for some given dimensions of the conduction channel. These concepts are utilized in the discussion that follows to illustrate the principles of operation of the invention.

Figure 4:
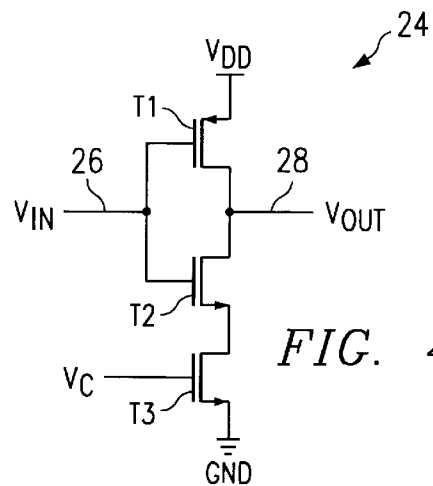
FIG. 4 is a partial schematic diagram of a voltage comparator in accordance with the present invention.

FIG. 4 is a schematic diagram of a portion 24 of a voltage comparator, in accordance with the preferred embodiment of the present invention. FIG. 4 shows an inverter circuit comprised of transistors T1 and T2, and a transistor T3 in the configuration of a control gate. FIG. 4 is discussed to illustrate basic principles of circuit operation. It is shown below that the circuit branch of FIG. 4 comprised of transistors T2 and T3 is but one branch of a cascade configuration of a more expanded comparator 30, shown in FIG. 5.

The conduction states of transistors T1 and T2 are determined by input voltage Vin on signal line 26 and the respective threshold voltages Vt for the transistors; the conduction state of transistor T3 is determined by its threshold Vt voltage and input voltage Vc.

It is seen in FIG. 4 that for some fixed voltage Vc that causes transistor T3 to conduct, transistors T1 and T2 behave as a simple inverter. As such, a positive going voltage for Vin causes transistor T2 to conduct more heavily and also causes transistor T1 to conduct less. Consequently, output voltage $V_{OUT}$ on signal line 28 approaches ground potential for a positive going input voltage Vin. Conversely, a negative going input voltage Vin causes transistor T1 to conduct more heavily and transistor T2 to conduct less, causing output voltage $V_{OUT}$ to approach $V_{DD}$.

It is further seen in FIG. 4 that for some fixed voltage Vc that places transistor T3 in a non-conducting state, transistor T2 cannot conduct current due to the series connection of transistor T3. The fixed input voltage Vc is thus able to negate the effect of transistor T2 with regard to the effect of Vin on output voltage $V_{OUT}$.

Figure 5:
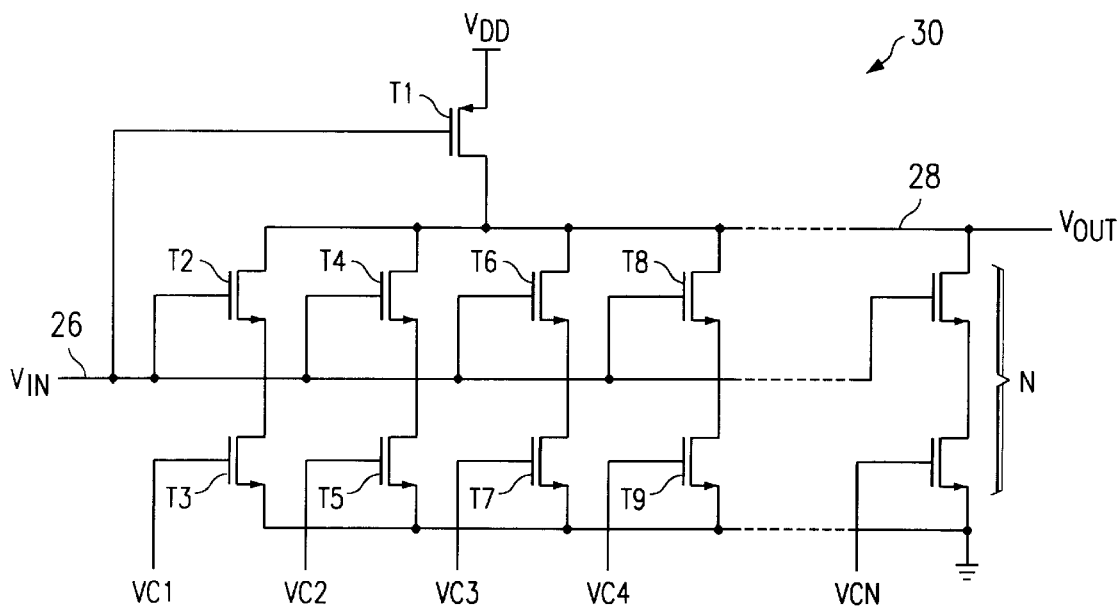
FIG. 5 is a complete schematic diagram of the voltage comparator in accordance with the present invention, shown partially in FIG. 4.

FIG. 5 shows the complete schematic of the voltage comparator of the preferred embodiment of the present invention with Vin on signal line 26 being the signal of interest as an input, $V_{OUT}$ on signal line 28 being an output logic signal, and signals Vc1 through VcN being externally supplied fixed control voltages. It is described in detail below that output signal $V_{OUT}$ changes logic state whenever input signal Vin attains some predetermined threshold (Vth) level in both positive and negative going directions, as is the case for a typical differential comparator circuit.

Control voltages Vc1 through VcN, as mentioned previously, are externally supplied. Possible sources and characteristics of voltages Vc1 through VcN are discussed in more detail below. Further, the means by which voltages Vc1 through VcN are supplied to the circuit of comparator 30 may vary as a function of the specific application.

As mentioned above, the circuit of comparator 30 shown in FIG. 5 is an expansion of the circuit portion 24 shown in FIG. 4. Note that the circuit branch of FIG. 4 comprised of transistors T2 and T3 is replicated in a cascade configuration as represented by transistors T4 through T9 in FIG. 5. Transistors T1 through T3 in FIG. 5 are similar to or the same as those in FIG. 4.

Circuit branch N of FIG. 5 is shown to indicate that any number of branches may be included in the cascade configuration. The number of circuit branches used will be determined by the degree of precision required in performing the threshold (Vth) detection function and the threshold (Vth) level required for the comparator, as dictated by the specific application requirements. The means by which improved precision is achieved and the threshold (Vth) level is set is presented below.

Figure 6:
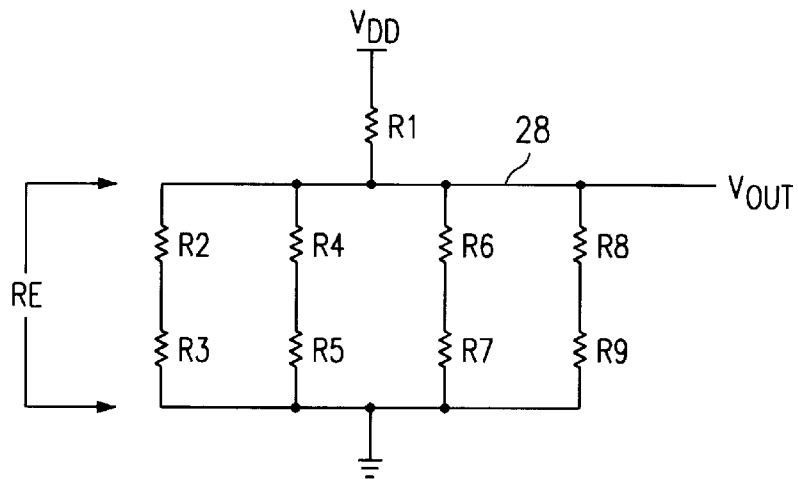
FIG. 6 is a partial equivalent electrical schematic diagram of the voltage comparator shown in FIG. 5.

FIG. 6 is a partial equivalent circuit of the comparator of FIG. 5 and is made up of the effective resistivities of transistors T1 through T9, represented by R1 through R9, respectively. The resistivity of a MOS transistor is a function of the conduction state of the transistor which will vary with gate voltage for a given threshold (Vt) voltage and conduction channel dimensions, in accordance with the empirical characterization presented earlier.

From FIG. 6 it can be shown that the voltage $V_{OUT}$ is determined by the voltage divider relationship expressed in Equation (1):

$$V_{OUT} = V_{DD} * (RE)/(R1+RE), \qquad \text{Eq. (1)}$$

where: R1 is the resistivity of transistor 1, and
RE is the parallel resistivity of transistors T2 through T9.
Resistivity RE is determined by the relationship expressed in Equation (2):

$$RE = \frac{(R2+R3)(R4+R5)(R5+R7)(R8+R9)}{(R2+R3+R4+R5+R6+R7+R8+R9)}. \qquad \text{Eq. (2)}$$

Referring to FIG. 5, the resistivity of transistor T1, a PMOS transistor, increases for an increase in the voltage applied to its gate. Also, the resistivities of transistors T2 through T9, all NMOS transistors, will decrease for an increase in the voltage applied to their gates. Conversely, the resistivity of transistor T1 will decrease and the resistivities of transistors T2 through T9 will increase for an decrease in the respective gate voltage.

It can be seen from the above discussion that the voltage $V_{OUT}$ is determined by the gate voltage applied to transistors T1 through T9 and their respective resistivities. As such, the voltage $V_{OUT}$, for some Vin, can be made to approach ground potential by decreasing the effective resistivity between signal line 28 and ground, which is accomplished by placing transistors T2 through T9 in a conductive state. $V_{OUT}$ can be made to approach $V_{DD}$ by increasing the effective resistivity between signal line 28 and ground, which is accomplished by placing transistors T2 through T9 in a non-conductive state. Output voltage $V_{OUT}$ can therefore be made to respond to Vin by causing transistors T2 through T9 to be placed in conductive or non-conductive states in some logical order until the desired $V_{OUT}$ is obtained.

The conduction states of transistors T2 through T9, as was stated previously, are also determined by control voltages Vc1 through Vc4. The circuit of FIG. 5 can be made to behave as an inverter having a threshold voltage controllable by appropriate selection of these control voltages.

Transistors T2, T4, T6, and T8 in FIG. 5, as a group, are constructed such that they exhibit successively higher values of conductance by varying the dimensions of their respective conduction channels. Likewise transistors T3, T5, T7, and T9, are constructed with the same properties, also as a group. The specific conductance values of the two groups, however, are not necessarily the same.

Transistors T2, T4, T6, and T8 are those in the branch circuits of FIG. 5 to whose gates the signal of interest Vin is applied. The use of transistors with successively increasing values of conductance provides an incremental control of the effective resistivity between signal line 28 and ground of FIG. 5. Therefore, the response of output voltage $V_{OUT}$ to input voltage Vin is determined incrementally by the conduction state of transistor T1, as determined by Vin, and the conduction states of the branch circuit transistors which is also determined by Vin and the control voltages Vc1 through Vc4.

Comparator 30 is thus able to accommodate any threshold (Vth) level that may be required for a signal of interest through the appropriate selection of the individual transistor conduction channel dimensions and the number of branch circuits used.

It was stated above that an improvement in precision can be achieved by increasing the number of branch circuits as indicated by branch N in FIG. 5. The use of four branch circuits allows the selection of up to sixteen possible combinations of conduction states of the branch circuits, assuming each branch circuit can be placed in either a conductive or non-conductive state. Adding a fifth branch circuit allows up to thirty-two possible combinations. By increasing the number of possible conduction states the incremental response of $V_{OUT}$ to Vin in FIG. 5 is made smaller which allows for a more precise setting of the comparator circuit threshold (Vth) level.

It will be shown below that the comparator circuit of the preferred embodiment of the present invention includes five branch circuits, one of which is kept in a conductive state at all times. This permits the selection of up to sixteen combinations of conduction states of the branch circuits and establishes a maximum value for the threshold (Vth) of the comparator. The remaining four branches may be placed in either a conductive or non-conductive state, providing up to sixteen increments of selection for the threshold (Vth) level between the minimum and maximum values of the signal of interest.

Figure 7:
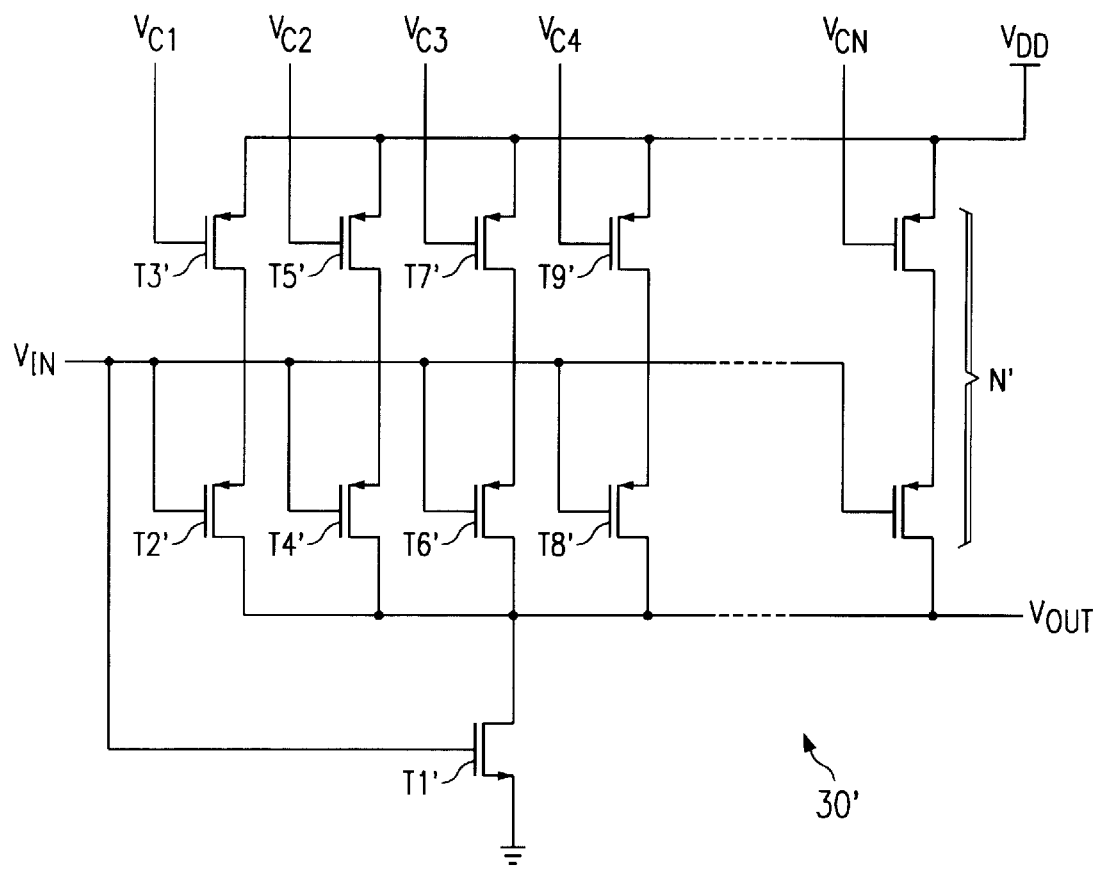
FIG. 7 is a schematic diagram of a first alternative embodiment of a voltage comparator in accordance with the present invention.

Numerous embodiments of the present invention may be constructed, in addition to the embodiment shown in FIG. 5. For example, FIG. 7 shows a comparator 30' similar to comparator 30 of FIG. 5. However, whereas in FIG. 5 a single PMOS transistor T1 is coupled between $V_{DD}$ and $V_{OUT}$, in FIG. 6 a single NMOS transistor T1' is coupled between ground and $V_{OUT}$. Like the gate of T1, the gate of transistor T1' is connected to $V_{IN}$. Similarly, the NMOS transistors T2–T9 of FIG. 5 coupled between $V_{OUT}$ and ground are replaced in FIG. 6 with PMOS transistors T2'–T9' coupled between $V_{OUT}$ and $V_{DD}$. Control voltages Vc1 through Vc4 are connected to the gates of transistors T3', T5', T7' and T9', and $V_{IN}$ is connected to the gates of T2', T4', T6' and T8'. Branch N' is shown to illustrate that an improvement in precision can be achieved by increasing the number of branch circuits as desired.

Operation of the comparator 30' of FIG. 6 is similar to that of comparator 30 of FIG. 5, as well, the difference between the two circuits being, essentially, that opposite conductivity devices are used, and the polarity of the required power supply connections are consequently reversed. Considerations of varying the threshold voltages of the branch transistors T2'–T8' and procedures for adjustment of the threshold voltage of the comparator 30' are essentially the same as those for comparator 30 of FIG. 5.

Figure 8:
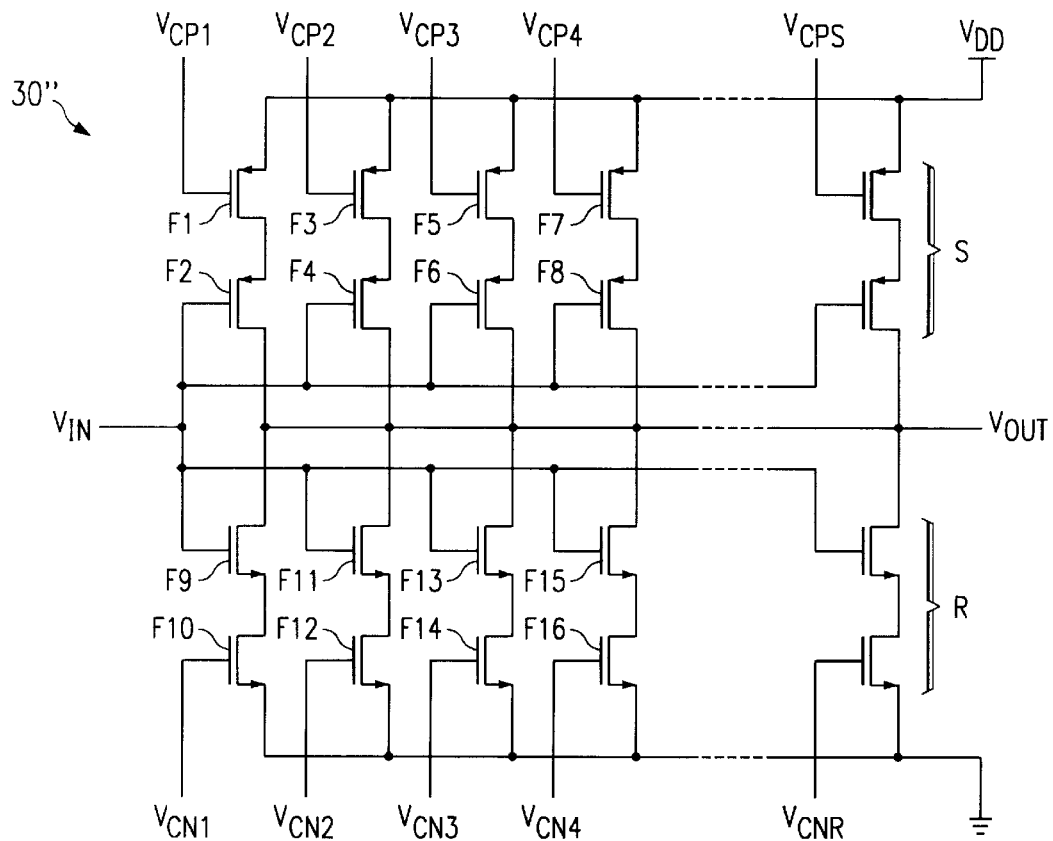
FIG. 8 is a schematic diagram of a second alternative embodiment of a voltage comparator in accordance with the present invention.

Another exemplary comparator 30'' is shown in FIG. 8. In this embodiment of the present invention four branch circuits comprising PMOS transistors F1–F8 are shown, that are similar to the four branch circuits comprising PMOS transistors T2'–T8' of FIG. 7, being controlled by control voltages $V_{CP1}$–$V_{CP4}$, respectively. In addition, four branch circuits comprising NMOS transistors F9–F16 are shown, that are similar to the four branch circuits comprising PMOS transistors T2–T8 of FIG. 5, being controlled by control voltages $V_{CN1}$–$V_{CN4}$, respectively. Branch S is shown to illustrate that an improvement in precision can be achieved by increasing the number of PMOS branch circuits as desired, while branch R is shown to illustrate that an improvement in precision can also be achieved by increasing the number of NMOS branch circuits as desired.

Control voltages $V_{CP1}$ through $V_{CP4}$ are connected to the gates of transistors F1, F3, F5 and F7, while control voltages $V_{CN1}$ through $V_{CN4}$ are connected to the gates of transistors F10, F12, F14 and F16.

Operation of the comparator 30'' essentially combines the principles of operation of comparator 30 (FIG. 5) and of comparator 30' (FIG. 7). Considerations of varying the threshold voltages of the branch transistors F1–F16, and procedures for adjustment of the threshold voltage of the comparator 30'' are essentially the same as those for comparators 30 and 30' of FIGS. 5 and 7, respectively, with no preference to NMOS transistors over PMOS transistors, nor vice versa, in considerations of setting of threshold voltage for a particular transistor, nor in selection of transistor for actual comparator threshold voltage adjustment. The threshold voltages for all transistors are simply all available for setting and selection to provide comparator threshold adjustability, as desired.

Returning to a description of the preferred embodiment, it was stated above that the means by which the control voltages Vc1 through VcN in FIG. 5 are supplied to the comparator may vary according to the specific application. The only constraints placed on these control voltages is that they be appropriate for the threshold (Vt) level for the transistors to which they are applied and remain fixed. Further, the control voltages are to be selected so as to place the respective branch transistors in either a conductive or non-conductive state, dependent upon the threshold (Vth) of the signal of interest and degree of precision required, as dictated by the specific application requirements. Still further, the control voltages may be selected through some digital means or other circuitry means as deemed appropriate for the specific application.

Figure 9:
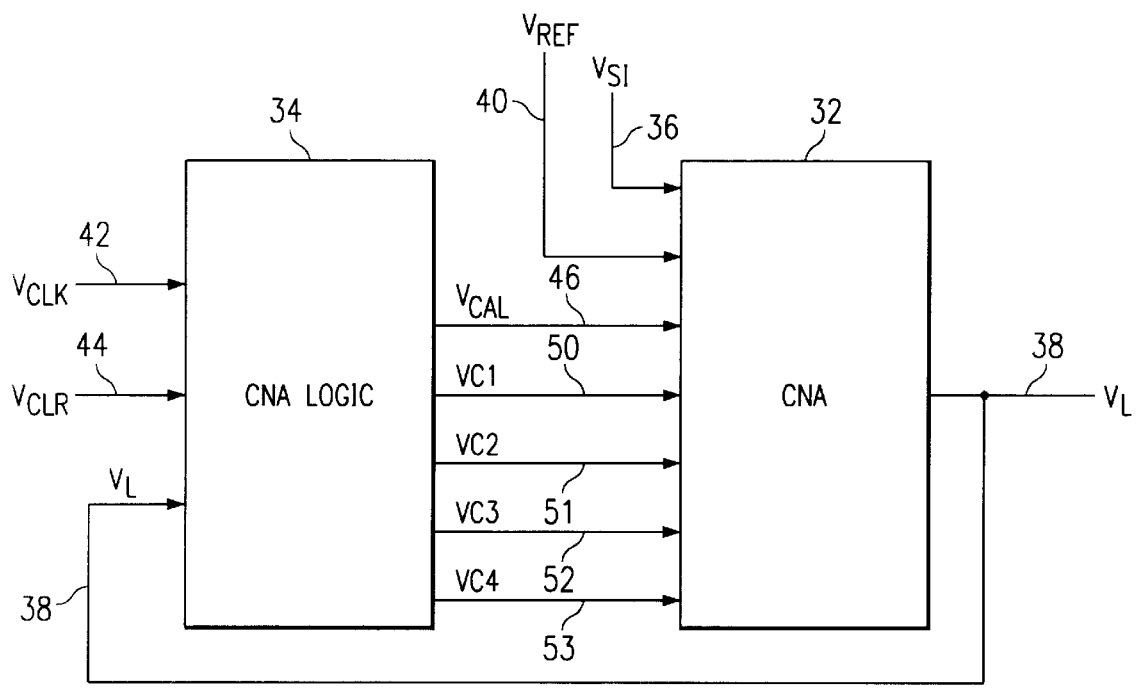
FIG. 9 is a block diagram showing the voltage comparator of FIG. 5 in a CNA block 32, together with a CNA Logic block 34 for controlling calibration of the voltage comparator.

FIG. 9 is a partial functional block diagram of an application of the preferred embodiment. Block 32, labeled CNA, includes a low power adjustable input threshold (Vth) control circuit, and block 34, labeled CNA Logic, includes the circuitry to perform a periodic calibration/adjustment of the threshold (Vth) level for the comparator 30 shown in FIG. 5. FIG. 9 also shows signal $V_{SI}$ on signal line 36 which is the signal of interest for the preferred embodiment, and signal $V_L$ on signal line 38 which is the logic signal which changes state whenever signal $V_{SI}$ has attained a predetermined threshold (Vth) value. Also shown are externally supplied signals $V_{REF}$ on signal line 40, $V_{CLK}$ on signal line 42, and $V_{CLR}$ on signal line 44. Signal $V_{REF}$ is a fixed reference voltage; signals $V_{CLK}$ and $V_{CLR}$ are clock and clear signals, respectively, utilized by flipflop devices (described below) within CNA Logic 34 for performing the periodic calibration/adjustment cycle.

FIG. 9 shows also signals Vc1 through Vc4 on signal lines 50 through 53, respectively, which are the fixed control voltages for the comparator circuit of FIG. 5. Also shown is signal $V_{CAL}$ on signal line 46 which is supplied by CNA Logic 34 to CNA 32 for use in performing a periodic calibration/adjustment cycle.

CNA Logic 34 includes the means to perform a periodic calibration/adjustment of the comparator circuit of FIG. 5 included in CNA 32 whenever signals $V_{CLK}$ and $V_{CLR}$ are active. This is discussed in more detail below. CNA Logic 34 also includes the means to cause signal $V_{REF}$ to be substituted for signal $V_{SI}$ within CNA 32, and also the means to detect the logic level of output signal $V_L$. CNA Logic 34 also includes the means to change the value of control voltages Vc1 through Vc4 in response to signal $V_L$.

CNA 32 also includes the means to substitute signal $V_{REF}$ in place of signal $V_{SI}$, whenever signal $V_{CAL}$ is active. This is also discussed in more detail below.

The periodic calibration/adjustment cycle can be summarized as follows: whenever signals $V_{CLK}$ and $V_{CLR}$ are active $V_{CAL}$ from CNA Logic 34 causes CNA 32 to substitute $V_{REF}$ for $V_{SI}$ as the signal of interest to the comparator circuit. Output signal $V_L$ is monitored by CNA Logic 34, which sequentially changes the values of control voltages Vc1 through Vc4 until an appropriate change occurs in the logic level of signal $V_L$. CNA Logic 34, again via signal $V_{CAL}$, then causes $V_{SI}$ to be reinstated as the signal of interest to the comparator circuit in CNA 32; control voltages Vc1 through Vc4 are kept at the values realized when $V_L$ changed logic state.

The performance of the aforementioned calibration/adjustment cycle is controlled from elsewhere within the preferred embodiment, via signals $V_{CLK}$ and $V_{CLR}$, as will be shown in a later discussion.

Figure 10:
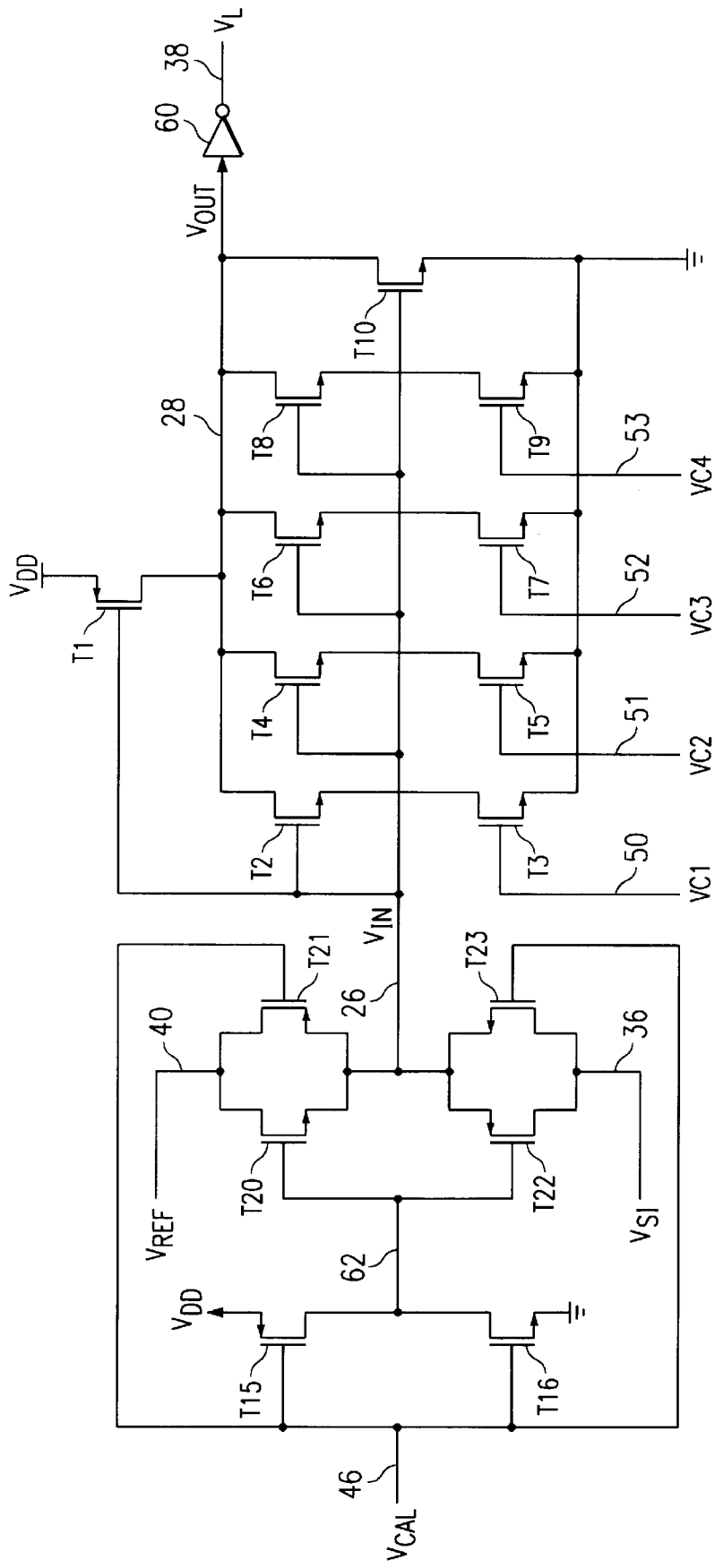
FIG. 10 is a schematic diagram of CNA block 32 of FIG. 9.

FIG. 10 is a schematic diagram of the circuitry of CNA 32 in FIG. 9 comprised of the adjustable input threshold (Vth) control circuit. As can be seen, FIG. 10 includes the comparator circuit of FIG. 5 described previously, comprised of transistors T1 through T9, and signal $V_{OUT}$ as an input to inverter 60, whose output is logic signal $V_L$ on signal line 38. Also shown are input signals $V_{SI}$, $V_{REF}$, and $V_{CAL}$ on signal lines 36, 40, and 46, respectively, corresponding to those of FIG. 9. Also included in the comparator circuit is transistor T10 which serves to enhance the precision of the electronic comparison by establishing a maximum value for the threshold (Vth) level of the comparator; otherwise, the comparator circuit functions as described previously.

In the discussion that follows only those parts of FIG. 10 not described previously are addressed.

Input signal $V_{CAL}$ is normally at a logic level high, causing transistor T15 to be off and transistor T16 to be on, further causing signal line 62 to approach ground potential. This in turn causes transistors T22 and T23 to be in conductive states, and transistors T20 and T21 to be in non-conductive states, allowing signal $V_{SI}$ to be passed to signal line 26 as signal Vin to the comparator.

It should be noted here that each of the transistor pairs T20/T21 and T22/T23 are transmission gates.

When the calibration/adjustment cycle described above is performed, input signal $V_{CAL}$ from CNA Logic 34 goes low, causing transistor T15 to be on and transistor T16 to be off. This further causes signal line 62 to approach $V_{DD}$ potential which results in transistors T22 and T23 to be in non-conductive states, and transistors T20 and T21 to be in conductive states. This causes signal $V_{SI}$ to be removed as Vin and signal $V_{REF}$ substituted in its place as the input to the comparator circuit. Upon conclusion of the calibration/adjustment cycle signal $V_{CAL}$ goes high and signal $V_{SI}$ is reinstated as the comparator circuit input.

As stated above, control voltages Vc1 through Vc4 in FIG. 10 on signal lines 50 through 53, respectively, are selected by CNA Logic 34 of FIG. 9 during the calibration/adjustment cycle so as to cause an appropriate change in output signal $V_L$, corresponding to the substituted signal of interest $V_{REF}$ being at the required threshold (Vth) level.

Figure 11:
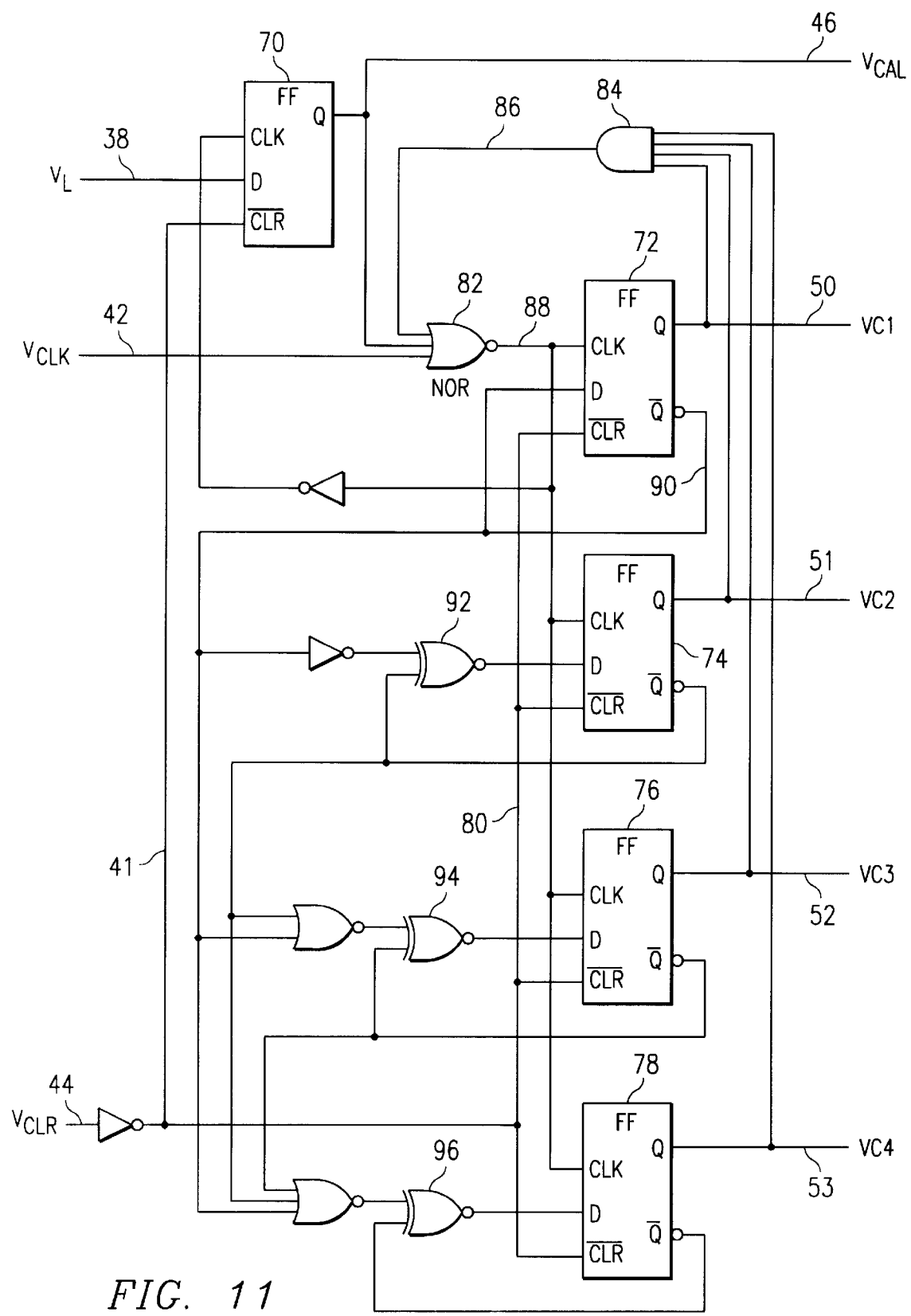
FIG. 11 is a logic diagram of the CNA Logic Block 34 of FIG. 9.
Figure 12:
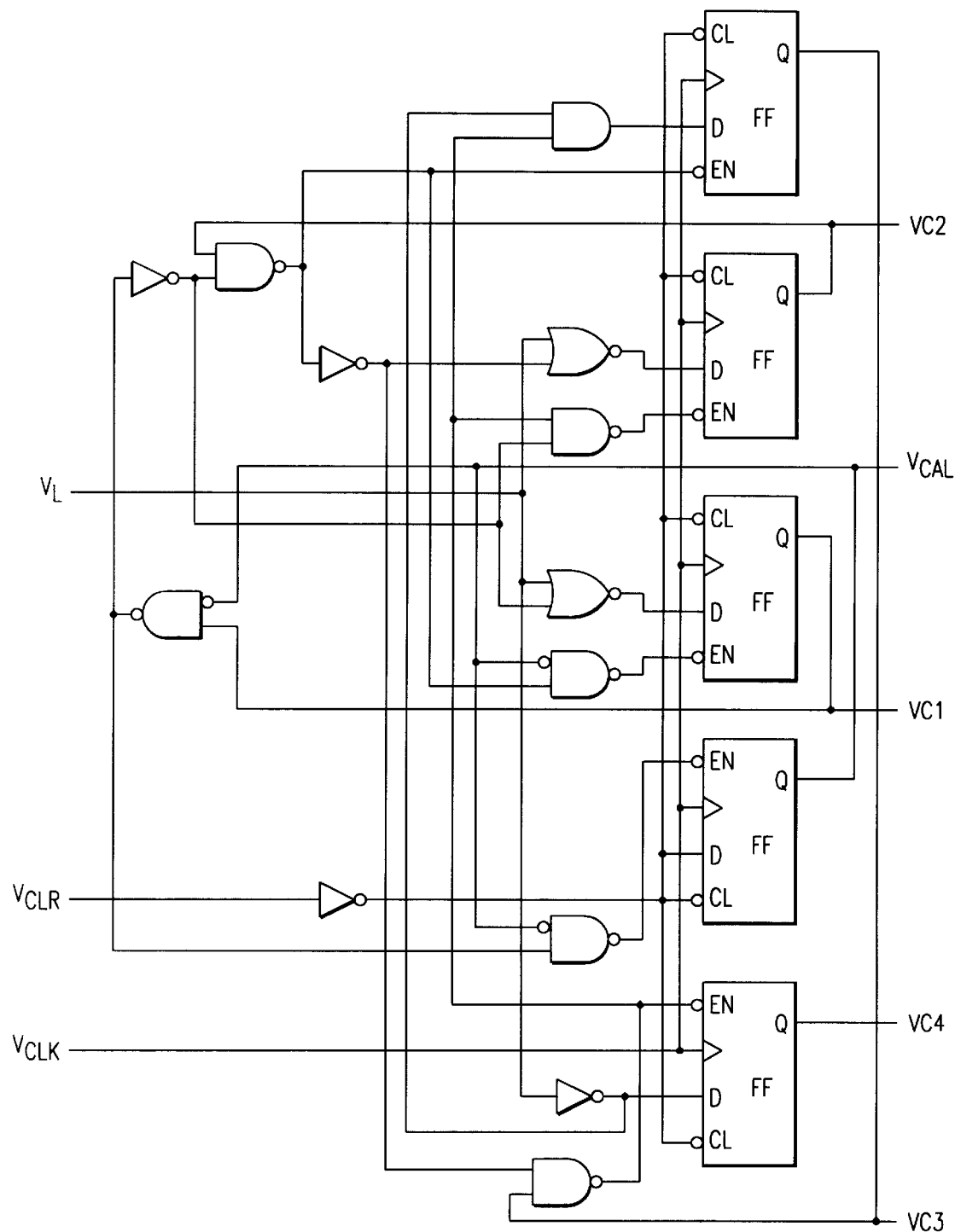
FIG. 12 is a logic diagram of an alternative embodiment of the CNA Logic Block 34.

FIG. 11 is a logic diagram for CNA Logic 34 shown in FIG. 9. It performs the aforementioned calibration/adjustment cycle in order to select the appropriate control voltages that set the threshold (Vth) level for the comparator circuit of FIG. 10. It should be noted that it is possible to design embodiments other than that shown in FIG. 11 to perform the calibration/adjustment cycle, or otherwise select the control voltages that set the threshold (Vth) level, using the principles of the present invention disclosed herein. FIG. 12, below, shows, for example, an alternative embodiment of CNA Logic 34.

The CNA Logic 34 of FIG. 11 includes flipflops 70 through 78 which are enabled D positive edge triggered flipflops with a clear input. Note that the clear input logic is negative, as shown by the bar over the label for the clear input, i.e., $\overline{CLR}$. Note also that the output is provided in positive logic, i.e., Q, and negative logic, i.e., $\overline{Q}$. Upon initiation of the calibration/adjustment cycle input signal $V_{CLR}$ on signal line 44 is active high long enough to place the Q output of each flipflop at a logic low, via signal line 80. This includes output signals $V_{CAL}$ and control voltages Vc1 through Vc4 on signal lines 46 and 50 through 53, respectively, which are input to CNA 32 in FIG. 9. Simultaneously, input clock signal $V_{CLK}$ is supplied as an input to gate NOR gate 82. Also supplied to NOR gate 82 is signal $V_{CAL}$, which is low, and the output signal from AND gate 84, via signal line 86, which is also low by virtue of signals Vc1 through Vc4 being low. NOR gate 82 is thus able to provide clock signal $V_{CLK}$ to each flipflop via signal line 88. Also at this time input signal $V_L$ from CNA 38 of FIG. 10 is low.

Upon receipt of clock signal $V_{CLK}$ the Q output of flipflop 72 goes high by virtue of its QZ output being high, since this QZ output is provided as the D input on signal line 90. The Q outputs of flipflops 74, 76, and 78 also go high, sequentially, as determined by the clock-triggering of each and the output state of exclusive-or gates 92, 94, and 96, which provide the respective D inputs. The circuit of FIG. 11 functions as a binary counter responding to signal $V_{CLK}$, in that the control voltages Vc1 through Vc4 are selected in an up-counting sequence until the calibration/adjustment cycle is terminated. The circuit is therefore able to select up to sixteen possible combinations of the control voltages.

The sequential process described above continues until all Q outputs are high, at which time the output of AND gate 84 goes high, causing the output of NOR gate 82 to go low and remain there, effectively removing the input clock signal from flipflops 72, 74, 76, and 78. However, the sequential process is abated if input signal $V_L$ from CNA 32 goes high, causing the Q output of flipflop 70 to go high, resulting also in the output of NOR gate 82 to go low and remain there. Input signal $V_L$ from CNA 32 will be high when the threshold (Vth) level of the comparator circuit is exceeded by the reference voltage $V_{REF}$.

It should be noted that the voltage levels of signals Vc1 through Vc4 remain as selected when the calibration/adjustment cycle ends.

FIG. 12 is a logic diagram of an alternative embodiment, logic block 98, for the CNA Logic 34 shown in FIG. 9. Logic block 98 utilizes enabled D positive edge triggered flipflops, as well as other conventional logic devices interconnected as shown in FIG. 12. The three flipflops at the top of the figure have a preset input, while the two flipflops at the bottom of the figure have a clear input. The logic block 98 generates a sequence of patterns for the activation of the control signals Vc1–Vc4, wherein the control signals correspond to a 4-bit binary count. The logic block 98 is wired to the CNA block 32 such that an incremental increase in that binary count causes an incremental decrease in the threshold level of the comparator 30 in CNA block 32. The pattern actually generated by logic block 98 is such that the CNA block 32 is initially tested at an intermediate binary count. Depending on the state of $V_L$, the next binary jump is either up or down. If $V_L$ is low, the count jump is to a higher value. On the other hand, if $V_L$ is high, the count jump is to a lower value. By making each such jump approximately half of the remaining range, the final value is arrived at in the minimum number of jumps. When $V_L$ finally changes in response to a single binary increment, then the logic in block 98 either simply stops and holds the then current pattern of control signals, in the case of a single positive binary increment, or, in the case of a single negative binary increment, the logic block 98 changes the binary pattern of control signals so as to advance the binary count up by one increment, and then holds that pattern. Thus, the logic in block 98 can result in a fewer number of patterns being tested before the desired threshold is achieved.

Figure 13:
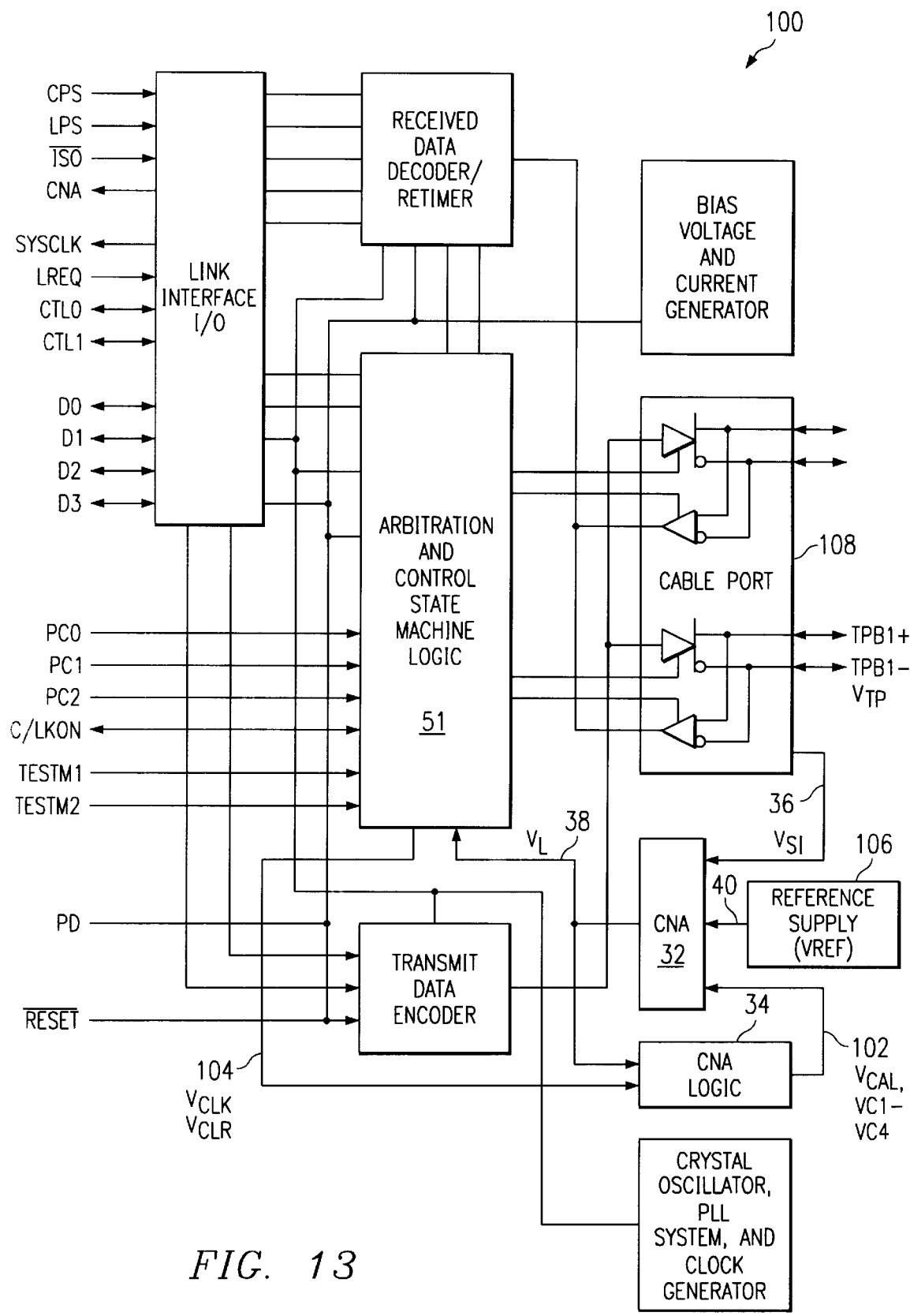
FIG. 13 is a functional block diagram showing an application of the preferred embodiment, an IEEE 1394 compliant Cable Transceiver/Arbiter device.

FIG. 13 is a partial functional block diagram of assignee's proprietary IEEE 1394 compliant Cable Transceiver/Arbiter semiconductor device 100. This figure depicts an embodiment of the invention in an exemplary application used for the purpose of detecting the presence or absence of a data transmission cable connected to a cable port of the device, and indicating the connection status to the control logic for the device.

It should be noted that signal lines 102 and 104 in FIG. 13 carry multiple signals, as follows: signal line 104 is comprised of signal lines 42 and 44 shown in FIG. 11 for signals $V_{CLK}$ and $V_{CLR}$, respectively; signal line 102 is comprised of signal lines 46 and 50 through 53 shown in FIG. 11 for signals $V_{CAL}$ and Vc1 through Vc4, respectively.

FIG. 13 shows CNA 32 with signals Vc1 through Vc4 and $V_{CAL}$ in signal line 102 from CNA Logic 34, signal $V_{REF}$ on signal line 40 from Reference Supply 106, and the signal of interest $V_{SI}$ from Cable Port 108 on signal line 36. Also shown are logic signal $V_L$ on signal line 38 from CNA 32 as an input to Arbitration and Control State Machine Logic ("Control Logic") 110 and CNA Logic 34, and signals $V_{CLR}$ and $V_{CLK}$ in signal line 104 from Control Logic 110 as inputs to CNA Logic 34.

The signal of interest $V_{SI}$ is a common mode voltage derived from bias voltage VTP supplied by the Cable Transceiver/Arbiter device through Cable Port 108 to the data transmission cable on terminals TPB1+ and TPB1−. When such cable is connected this common mode voltage is supplied to CNA 32 via signal line 36 which causes logic signal $V_L$ to go high, indicating to Control Logic 110 that the cable is connected and thereby allowing data transmission. When such cable is disconnected the common mode voltage is absent, causing logic signal $V_L$ to go low and thereby inhibiting data transmission.

The aforementioned calibration/adjustment cycle is initiated by Control Logic 110 by providing signals $V_{CLK}$ and $V_{CLR}$ to CNA Logic 34, as was described previously. Typical implementation of the calibration/adjustment cycle would be at system power-up and during system idle times.

Control of Reference Supply 106 is accomplished by Control Logic 110 of the device, and need be turned on only during the calibration/adjustment cycle.

The implementation of the principles of the present invention in CNA 32 and accompanying CNA Logic 34 provides a significant reduction in power consumption by requiring the reference supply to be turned on only during the calibration/adjustment cycle, and by utilizing circuitry that behaves as an inverter in place of a differential comparator.

The prior art would require 150–250 microamps for the comparator and 200–300 microamps for the reference supply, both being turned on continuously, for some $V_{DD}$.

By contrast, the combined circuitry of CNA 32 and CNA Logic 34 requires 10–15 microamps continuously, and 200–300 microamps for the reference supply only when turned on, for some $V_{DD}$.

CNA 32 also provides an improvement in the propagation delay of the logic state change of 8–15 nanoseconds versus 15–20 nanoseconds for the prior art.

Although the present invention and its advantages have been described in detail, it should be understood that various changes, substitutions and alterations can be made herein without departing from the spirit and scope of the invention as defined by the appended claims. For example, a preferred embodiment of comparator, shown in FIG. 5, utilizes only one configuration of NMOS and PMOS transistor types with different threshold voltages throughout the description for ease of explanation. The scope of the invention is not limited to this single configuration, but rather includes any number of configurations or mix of transistor types as would be determined by detailed application performance requirements. The number of transistor types may also be greater or less than that presented in this description, also as would be determined by detailed application requirements. Two additional configurations were shown above, by way of example, in FIGS. 7 and 8. Others will be readily apparent to those of ordinary skill in the art, once the principles set forth herein are understood.

Likewise, a preferred embodiment of control logic circuitry was shown above in FIG. 11. Other configurations will be readily apparent to those of ordinary skill in the art, providing, for example, different sequences for the succession of control voltage patterns. An additional configuration was shown above, by way of example, in FIG. 12. Others will be readily apparent to those of ordinary skill in the art, once the principles set forth herein are understood.

All such configurations are considered to be within the scope of the invention, which is defined solely by reference to the appended claims.

What is claimed is:

1. A variable threshold comparator receiving, on an input node, an input signal having a voltage, and providing an output signal on an output node when said voltage of said input signal exceeds a selectable threshold voltage of said comparator, comprising:

a transistor coupled by way of its source and drain between a first polarity power supply node and an output node, and having its gate coupled to said input node;

a plurality of pairs of transistors, each pair in said plurality of pairs of transistors being coupled together by a source of a first one of said each pair of transistors and a drain of a second one of said each pair of transistors, and coupled in series between said output node and a second polarity power supply node, a gate of said first one of said each pair of transistors coupled to said input node, and a gate of said second one of said each pair of transistors coupled to a control signal specific to said second one of said each pair of transistors;

wherein said threshold voltage of said comparator is selectable by the application of one or more of said control signals to a respective one or more of said second ones of said each pair of transistors; and a calibration sequencer, said calibration sequencer comprising:
   a reference voltage source, for use as a temporary substitute for said input signal;
   means for automatically sequencing different selections of said control signals while monitoring said output signal;
   means for determining and holding an optimum selection of said control signals; and means for continuing to provide said optimum selection of said control signals, while removing said reference voltage such that said input signal may be applied to said input node.

2. A method for calibrating a comparator capable of receiving a plurality of control signals for selectable adjustment of the threshold voltage of said comparator, comprising the steps of providing reference voltage as a temporary substitute for an input signal to said comparator, and then:

providing automatically to said comparator a sequence of different selections of said control signals while monitoring said output signal;

determining and holding an optimum selection of said control signals; and continuing to provide said optimum selection of said control signals, while removing said reference voltage such that said input signal may be applied to said comparator.

\* \* \* \* \*